(12) United States Patent
Nakamura (10) Patent No.: US 7,824,520 B2
(45) Date of Patent: Nov. 2, 2010

(54) PLASMA TREATMENT APPARATUS

(75) Inventor: Osamu Nakamura, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 28 days.

(21) Appl. No.: 10/807,472

(22) Filed: Mar. 24, 2004

(65) Prior Publication Data

US 2004/0238124 A1 Dec. 2, 2004

(30) Foreign Application Priority Data

Mar. 26, 2003 (JP) ............................. 2003-086384

(51) Int. Cl.
*C23C 16/00* (2006.01)
*C23F 1/00* (2006.01)
*H01L 21/306* (2006.01)
*H05B 31/26* (2006.01)
*B44C 1/22* (2006.01)
*C03C 15/00* (2006.01)

(52) U.S. Cl. ........................ 156/345.43; 156/345.44; 156/345.45; 156/345.46; 156/345.47; 156/345.38; 118/723 E; 118/723 ER; 315/111.21; 216/71

(58) Field of Classification Search ............ 156/345.38, 156/345.41, 345.47; 118/723 E; 216/71
See application file for complete search history.

(56) References Cited

U.S. PATENT DOCUMENTS

| | | | |
|---|---|---|---|
| 5,185,132 A | 2/1993 | Horiike et al. | |
| 5,652,029 A | 7/1997 | Itoh | |
| 6,001,431 A | 12/1999 | Itoh et al. | |
| 6,001,432 A | 12/1999 | Yamazaki et al. | |
| 6,538,387 B1 * | 3/2003 | Seki et al. | 315/111.21 |
| 6,777,880 B2 * | 8/2004 | Morfill et al. | 315/111.21 |
| 6,827,870 B1 * | 12/2004 | Gianchandani et al. | 216/71 |
| 2002/0064597 A1 * | 5/2002 | Suzuki et al. | 427/162 |

(Continued)

FOREIGN PATENT DOCUMENTS

EP 0 431 951 6/1991

(Continued)

OTHER PUBLICATIONS

JP 2003-059909_Eng 28 Feb. 2003.*

(Continued)

*Primary Examiner*—Parviz Hassanzadeh
*Assistant Examiner*—Rakesh Dhingra
(74) *Attorney, Agent, or Firm*—Nixon Peabody LLP; Jeffrey L. Costellia (57) ABSTRACT

In the case of generating plasma under atmospheric pressure, the particle generated due to generation of high-density plasma is to be a cause of a defect such as a point defect or a line defect of a display portion in a display device. The present invention is offered in view of the above situation, and provides a plasma treatment apparatus for suppressing generation of a particle. According to the present invention, plasma is generated in a limited minimum region to be treated by a plasma treatment over a substrate to be treated. Generation of a particle is suppressed to a minimum by providing a plurality of plasma generation units generating minimum plasma having a similar size as the limited minimum region, changing a relative position of the plurality of plasma generation units and the substrate to be treated, and performing a plasma treatment to a limited predetermined region.

20 Claims, 8 Drawing Sheets

U.S. PATENT DOCUMENTS

| | | | |
|---|---|---|---|
| 2003/0104141 A1* | 6/2003 | Amato-Wierda et al. | 427/580 |
| 2003/0106788 A1* | 6/2003 | Babko-Malyi | 204/164 |
| 2004/0115402 A1* | 6/2004 | Schaepkens | 428/174 |
| 2004/0185673 A1 | 9/2004 | Ichijo et al. | |

FOREIGN PATENT DOCUMENTS

| | | |
|---|---|---|
| JP | 4-358076 | 12/1992 |
| JP | 9-070669 | 3/1997 |
| JP | 11-308065 A | 11/1999 |
| JP | 2000-109979 | 4/2000 |
| JP | 2002-237480 A | 8/2002 |
| JP | 2002-320845 | 11/2002 |
| JP | 2003-059909 | 2/2003 |
| JP | 2004-363321 | 12/2004 |
| WO | WO 01/27969 * | 4/2001 |

OTHER PUBLICATIONS

JP 2002-320845_Eng_112002.*

* cited by examiner

FIG. 1 electrode unit

PLASMA TREATMENT APPARATUS

BACKGROUND OF THE INVENTION

1. Field of the Invention

The present invention relates to a plasma treatment apparatus for forming an active layer and a wiring over a substrate. Moreover, the present invention relates to a plasma generation unit of a plasma treatment apparatus for film formation, etching or surface modification.

2. Related Art

A thin film transistor (TFT) formed over a substrate having an insulating property is widely applied to an integrated circuit and the like. Especially, the TFT is used a lot as a switching element in a display portion of a thin display device represented by a liquid crystal television receiver or the like, and has been widely used for a portable terminal, a large-sized display device, and the like.

As for a display device using a conventional TFT, a film is formed over an entire surface of a substrate, and a TFT is formed by applying photolithography, etching, and ashing. More than half of these processes for manufacturing the TFT are often performed in vacuum equipment.

In recent years, a large-sized liquid crystal display device has been attracting a lot of attention. Accordingly, a size of mother glass is enlarged, thereby enlarging a size of vacuum equipment and requiring a larger-scale facility investment.

In such the situation, a plasma treatment can be performed with a glow discharge maintained without shifting to an arc discharge even under atmospheric pressure by using a method for applying a pulsed electric field as a plasma generating unit, which has been attracting a lot of attention in recent years.

In the case of generating plasma under atmospheric pressure, a particle is easily generated due to generation of high-density plasma. The particle is to be a cause of a defect such as a point defect or a line defect in a display portion of a display device.

SUMMARY OF THE INVENTION

The present invention is offered in view of the above problems, and it is an object of the invention to provide a plasma treatment apparatus for suppressing generation of a particle.

Plasma is generated in a limited minimum region to be treated by a plasma treatment over a substrate to be treated. The minimum region is a region where an island semiconductor region (active layer) and a wiring are formed in a whole region of a TFT substrate over which a semiconductor integrated circuit is formed, and an area ratio thereof to the whole region of the substrate is only from several percent to several tens of percent. Consequently, generation of a particle is suppressed to a minimum by providing a plurality of plasma generation units generating minute plasma in a limited minimum region to a plasma treatment apparatus, changing a relative position of the plasma generation unit and the substrate to be treated, and performing a plasma treatment to a limited predetermined region.

Not only is a particle suppressed, but a plasma treatment can be performed directly to a limited predetermined region by generating plasma in a limited region having a similar size as the island semiconductor region and the wiring. Accordingly, a photolithography process becomes unnecessary, which can reduce steps.

Further, sizes of electrodes which constitute a plasma generation unit are not required to be uniform, and electrodes of various sizes may be mixed appropriately.

A plasma treatment apparatus comprising: a plurality of plasma generation units composed of a plurality of opposed electrodes for film formation, etching, or surface modification; a gas supply unit for introducing a process gas into between the plurality of opposed electrodes; wherein the plurality of plasma generation units are arranged linearly in one line or a plurality of lines; is given as a specific structure of the present invention.

Further, a plasma treatment apparatus comprising: a plurality of plasma generation units composed of a plurality of opposed electrodes for performing film formation, etching, or surface modification over a substrate to be treated; and a gas supply unit for introducing a process gas into between the plurality of opposed electrodes; wherein the plurality of plasma generation units are arranged linearly in one line or a plurality of lines; wherein at least one of the plurality of opposed electrodes has a length of equal to or less than 1 mm on a side of the substrate to be treated; is also given.

Moreover, plasma treatment apparatus comprising: a plurality of plasma generation units composed of a plurality of opposed electrodes for performing film formation, etching, or surface modification over a substrate to be treated; a gas supply unit for introducing a process gas into between the plurality of opposed electrodes; a unit for forming a pattern over the substrate to be treated by the plurality of plasma generation units; wherein the plurality of plasma generation units are arranged linearly in one line or a plurality of lines; wherein at least one of the plurality of opposed electrodes has a length of equal to or less than a square of a line width of the pattern on a side to be treated; is given.

As another structure, the pattern is a wiring pattern.

In the above structures, a unit for controlling a voltage applied to a predetermined electrode at predetermined timing by connecting the plurality of electrodes to a pulsed power source and a computer through a control circuit is provided. In addition, a unit for controlling plasma generation from the predetermined electrode onto the substrate to be treated by synchronizing timing of scanning a substrate stage to which the substrate to be treated is fixed or an electrode unit comprising the plurality of plasma generation units and of applying a voltage to the predetermined electrode is provided.

In addition, in the above structures, the plasma treatment apparatus is provided with a unit such as a sensor for positioning one of the plasma generation units to the substrate to be treated or the wiring pattern on the substrate to be treated.

As another structure, electrodes of the plurality of plasma generation units can be formed by processing an alloy such as stainless steel or brass, or a conductive material such as copper or aluminum with the use of a focused ion beam apparatus, photolithography, or a laser lithography apparatus. In other words, a plasma generation treatment apparatus having a plasma generation unit in which a shape and a size of an electrode are controlled can be used by applying these treatments. For instance, film formation, etching, or surface modification can be performed appropriately in the most suitable condition by using a plasma treatment apparatus having a plurality of plasma generation units in which sizes of electrodes are different from each other.

As another structure, the film formation, the etching, or the surface modification is performed by applying a pulsed electric field into between electrodes under atmospheric pressure or under pressure approximate to atmospheric pressure.

The pressure approximate to atmospheric pressure means pressure in the range of from 600 Pa to 106000 Pa. However, not necessarily limited to the values, the pressure includes a low-level positive-pressure condition due to a gas flow or the like.

Note that the plasma treatment apparatus described here denotes all apparatuses utilizing plasma such as a film formation apparatus by CVD, sputtering, or the like, a processing apparatus by etching, ashing, or the like, and a surface treatment apparatus by washing, surface modification, or the like.

The present invention includes a semiconductor device manufactured by using the above-described plasma treatment apparatus and a method for manufacturing a semiconductor by using the plasma treatment apparatus. Further, the present invention also includes a method for manufacturing a semiconductor device in which one island semiconductor layer over a substrate to be treated is formed by plasma from one plasma generation unit and a semiconductor device manufactured by the method.

These and other objects, features and advantages of the present invention will become more apparent upon reading of the following detailed description along with the accompanied drawings.

DETAILED DESCRIPTION OF THE INVENTION

This application is based on Japanese Patent Application serial no. 2003-086384 filed in Japan Patent Office on Mar. 26, in 2003, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

[Embodiment Mode 1]

The present invention relates to a method for performing a treatment or to a plasma treatment apparatus that can perform a treatment, by generating plasma to a limited region where an active layer is formed or a limited region where a wiring is formed over a substrate. Hereinafter, a plasma treatment apparatus having a plurality of minute flat plate electrodes is described specifically with reference to FIG. 1.

Figure 1:
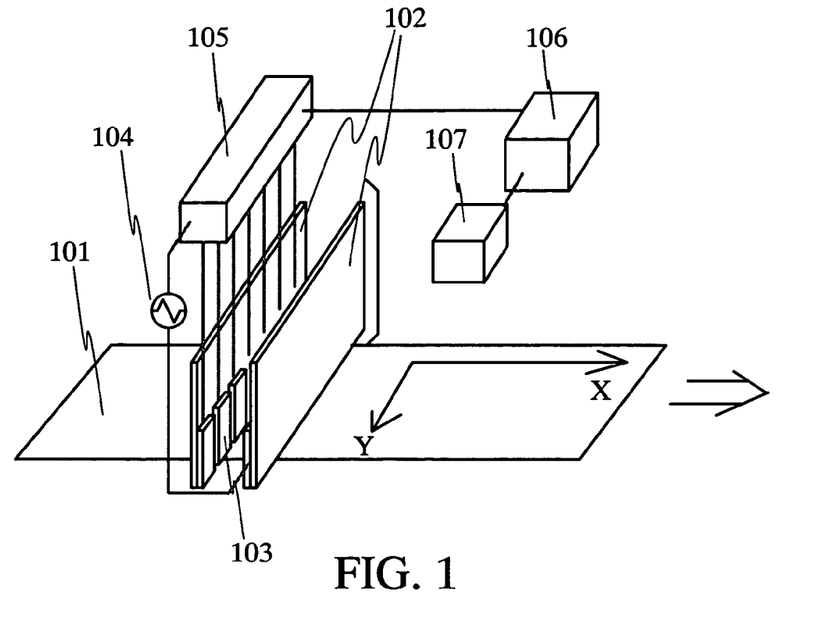
FIG. 1 explains a plasma treatment apparatus of the present invention.

Two substrates 102 made of a material such as quartz, ceramic, or resin are arranged opposite to each other, thereby constructing a plasma chamber. A plurality of minute rectangular metal electrodes 103 is formed on the surface of the substrate 102. Length of at least one side of the minute rectangular metal electrode is preferably equal to or less than 1 mm. Hence, microfabrication is preferably applied to these minute metal electrodes by using photolithography, a focused ion beam apparatus, a laser lithography apparatus, or the like.

Specifically, the electrode can be formed by processing an alloy such as stainless steel or brass, or a conductive material such as copper or aluminum with the use of a photolithography, a focused ion beam apparatus, or a laser lithography apparatus. On this occasion, a plasma treatment apparatus having a plasma generation unit for different purposes can be formed by controlling a shape and a size of an electrode to be processed. For example, in the case of forming a wiring pattern over a substrate, various kinds of wiring patterns can be formed at a time by performing a plasma treatment with the use of a plasma treatment apparatus comprising a plasma generation unit composed of an electrode suited to a width of a wiring pattern.

An alloy such as stainless steel or brass, or a conductive material such as copper or aluminum is used for the metal electrode 103. The plurality of metal electrodes 103 is formed inside of one side of opposed substrates, and an electrode formed on the other side is to be one continuous electrode. Further, the electrode unit is not limited to the one continuous electrode in the present invention, and a plurality of metal electrodes can be formed on both sides of opposed substrates. Moreover, a partition wall is preferably provided so that gas is introduced into each electrode separately.

Furthermore, an electrode surface is generally covered with a dielectric film. Zirconium dioxide, titanium dioxide, barium titanate, or the like or a mixture thereof is used for the dielectric film. A gap between opposed electrodes is preferably equal to or less than 1 mm, but the gap may be equal to or more than 1 mm because it depends on a quality of a dielectric material, a thickness of a dielectric film, an applied voltage, or the like. In this case, an outlet for plasma is preferably processed to be small by using an insulating resin, or the like.

Thus, the one minute metal electrode 103 and the electrode provided on the other opposed substrate constitute one minute plasma generation unit, and a plurality of the minute plasma generation unit constitutes one electrode unit. A substrate to be treated 101 is disposed in an appropriate position so as to be in contact with plasma generated from the electrode unit. In the case of worrying about plasma damage, a plurality of electrodes are arranged so as not to contact with the substrates to be treated directly, and a process gas is preferably supplied to the substrate to be treated by optimization of a supply pressure.

Figure 2A:
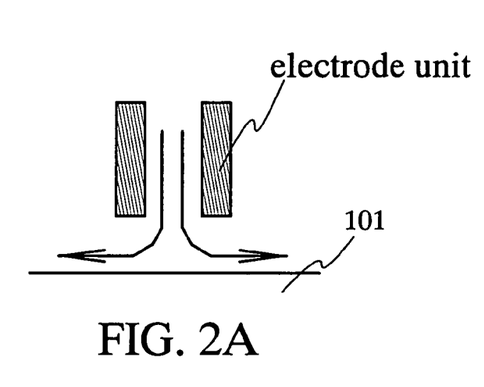
FIGS. 2A to 2D show a process gas flow of the present invention schematically.
Figure 2B:
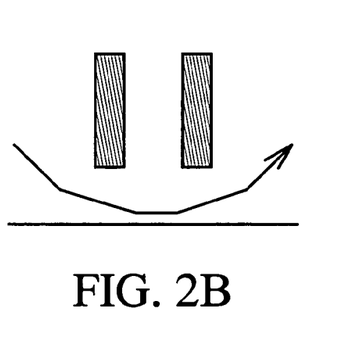
Figure 2C:
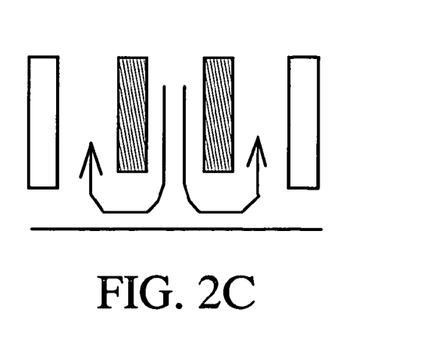
Figure 2D:
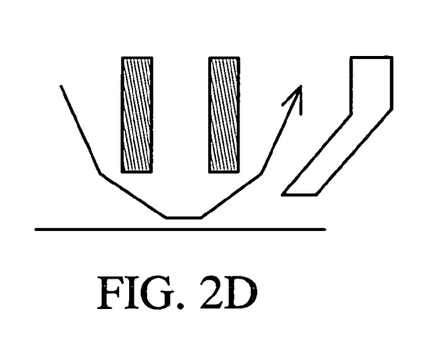

Subsequently, process gas supply is described. A process gas is necessary to be supplied to between the electrode unit and the substrate to be treated 101, and the plasma treatment apparatus comprises a gas supply unit and an exhaust unit. FIGS. 2A to 2D show a process gas flow supplied from the gas supply unit schematically. In FIG. 2A, a structure in which a process gas is discharged onto the substrate to be treated 101 from the plasma chamber is shown. In FIG. 2B, a structure in which a process gas passes through between the electrode unit and the substrate to be treated 101 is shown. Further, in the case of performing a plasma treatment under atmospheric pressure, an exhaust unit is preferably provided, and a unit for exhausting a process gas in ways as shown in FIGS. 2C and 2D is preferably implemented.

For example, $SiH_4$, $Si_2H_6$, or a diluted gas with hydrogen, helium, or the like is used as a process gas in forming a Si film. A reactive gas such as $CF_4$, $SF_6$, $Cl_2$, or $O_2$ is used in etching and surface modification.

Plasma is generated in the plasma chamber by applying a pulsed electric field into between the electrodes with a process gas introduced into the electrode unit. The present invention is not always limited to under atmospheric pressure, and the present invention can be carried out even in a vacuum atmosphere. And in this case, an electric field is applied by a high frequency power source. Each of the minute metal electrodes 103 is connected to a pulsed power source 104 and a computer 106 through a control circuit 105, and minute plasma can be generated in a predetermined position over the substrate to be treated by applying a pulsed electric field into between predetermined electrodes at predetermined timing. A relay circuit may be appropriately incorporated in the control circuit 105. Further, the control circuit itself may be formed over the substrate 102.

An alignment unit for positioning the plasma generation unit to the substrate to be treated or to a pattern formed over the substrate to be treated by using a plasma treatment apparatus is necessary, and the computer 106 is also connected to the alignment unit 107.

A plasma treatment proceeds by changing the relative position of the substrate to be treated 101 and the electrode that are moved in an X direction and a Y direction. By using a plasma treatment apparatus comprising the above-described structures, a plasma treatment can be performed in a limited minimum region to be treated over the substrate, and generation of a particle can be suppressed.

[Embodiment Mode 2]

In the embodiment mode 1, a structure in which an electrode unit of a plasma treatment apparatus has a plurality of metal electrodes and one continuous opposite electrode is described. In this embodiment mode, a plasma treatment apparatus having another structure is described with reference to FIGS. 5A to 5E.

Figure 5A:
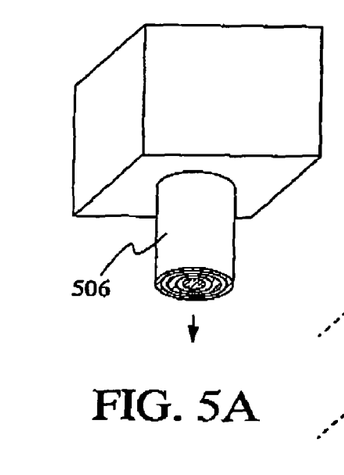
FIGS. 5A to 5E explain a plasma generation unit of the present invention.
Figures 5B, 5C, 5D:
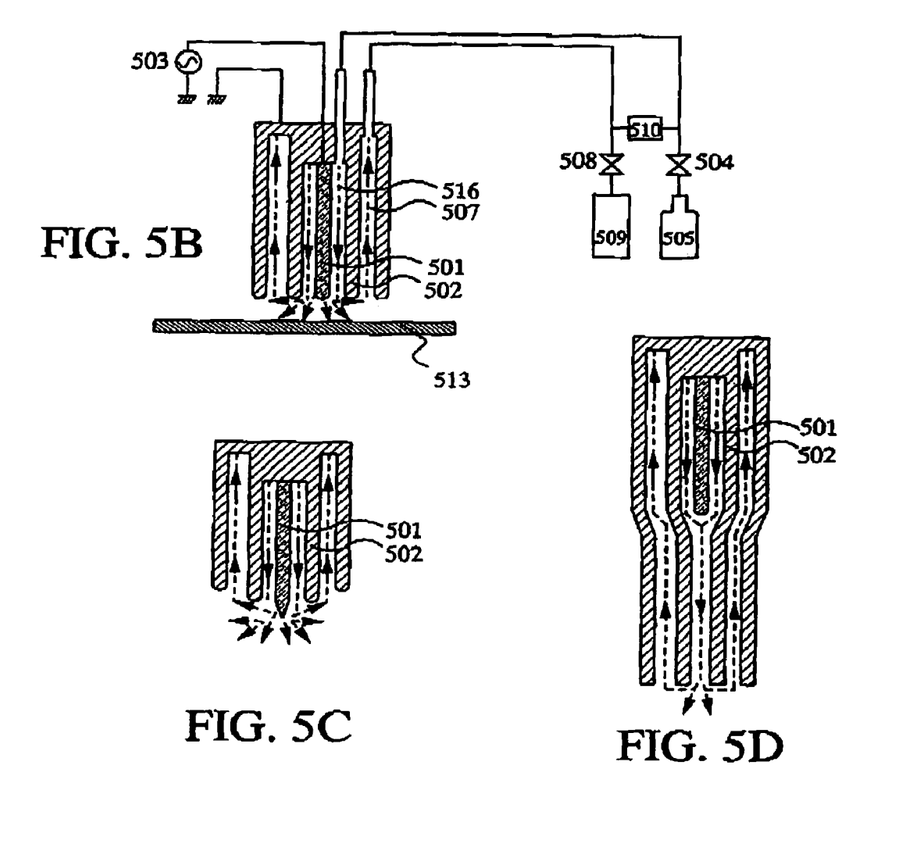

FIG. 5A shows a perspective view of a plasma generation unit 506 having a cylindrical electrode, and FIGS. 5B to 5D show a cross-sectional view of the cylindrical electrode.

In FIG. 5B, a dotted line shows a path of a process gas 516, and reference numerals 501 and 502 denote electrodes made of a conductive metal such as aluminum or copper, and a first electrode 501 is connected to a power source 503. A cooling apparatus for circulating cooling water may be connected to the first electrode 501. When the cooling apparatus is provided, a rise in temperature at the time of continuously performing a surface treatment can be avoided by circulation of cooling water, and efficiency can be improved by a continuous treatment.

A second electrode 502 surrounds the first electrode 501, and is connected to ground electrically. And the first electrode 501 and the second electrode 502 are cylindrical having a nozzle-shaped gas pore at a tip thereof.

A space between the first electrode 501 and the second electrode 502 is supplied with a process gas 516 from a gas supply unit (gas cylinder) 505 through a valve 504. Then, atmosphere of the space is replaced, and plasma is generated in the space by applying a high frequency voltage (from 10 MHz to 500 MHz) to the first electrode 501 from a power source 503 in this state.

And, when a reactive gas including chemically active excited species such as ion or radical that is generated by the plasma is discharged to a surface of a subject 513, a predetermined surface treatment can be performed on the surface of a subject 513.

Note that a process gas to be filled in the gas supply unit (gas cylinder) 505 is appropriately selected in accordance with a kind of a surface treatment performed in a treatment chamber. An exhaust gas 507 is introduced into an exhaust unit 509 through a valve 508.

In addition, whole of the process gas 516 is not used in a plasma process, and an unreacted gas is included in the exhaust gas 507. Generally, the exhaust gas is detoxified in an exhaust gas processing apparatus, and is disposed or recovered. However, by making a component of the unreacted gas in the exhaust gas reflux as the process gas 516 through a filter 510, the utilization efficiency of the process gas can be raised and the exhaust gas emission can be suppressed.

FIGS. 5C and 5D show a cylindrical plasma generation unit 506 having a cross section different from that of FIG. 5B. A plasma generation unit 506 shown in FIG. 5C has such a shape that the first electrode 501 is longer than the second electrode 502 and the first electrode 501 is acute-angled. Further, a plasma generation unit 506 shown in FIG. 5D has such a shape that a reactive gas including the chemically active excited species generated between the first electrode 501 and the second electrode 502 is discharged externally. The cylindrical plasma generation unit is described as an example in this embodiment mode, but not particularly limited to a cylindrical shape, and a plasma generation unit of any shape may be used.

Figure 5E:
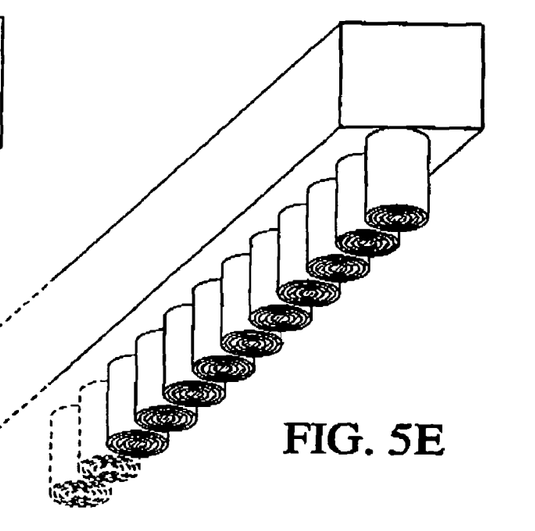

Further, FIG. 5E shows a plurality of discharging nozzles of plasma arranged in one axis direction.

The distance between the tip of the plasma generation unit and the surface of the subject is required to be kept equal to or less than 3 mm, preferably equal to or less than 1 mm, and more preferably equal to or less than 0.5 mm. For this reason, the distance between the plasma generation unit and the surface of the subject may be kept constant by using a distance sensor, for example.

According to the present invention using the plasma treatment apparatus which can be operated under atmospheric pressure, time for vacuuming and relieving a pressure, which is necessary for a pressure reducing device, is not required, and a complicated vacuum apparatus need not be arranged. Specifically, in the case of using a large-sized substrate, a size of a chamber is enlarged consequently, and longer processing time is required to make inside of the chamber under reduced pressure. Therefore, the apparatus of the present invention that can be operated under atmospheric pressure is effective in reducing a manufacturing cost.

[Embodiment Mode 3]

In this embodiment mode, in the case of manufacturing a semiconductor device by using a transparent substrate as a substrate to be treated, a substrate with a large area as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm is used.

A manufacturing cost can be reduced by using such the large-sized substrate. A glass substrate such as a barium borosilicate glass or an aluminoborosilicate glass represented by #7059 glass and #1737 glass of Corning, Inc. can be used for the substrate. Furthermore, various transparent substrates such as quartz, a semiconductor, plastics, a plastic film, metal, glass epoxy resin, and ceramic can be used.

[Embodiment Mode 4]

In this embodiment mode, a method for manufacturing a semiconductor device with the use of the plasma treatment apparatus shown in the embodiment modes 1 and 2 is described with reference to FIGS. 6A to 6C, 7A to 7C, 8A to 8C, and 9A to 9D. Note that a display device exemplified here is an active matrix display device provided with a TFT for each pixel.

Figure 6A:
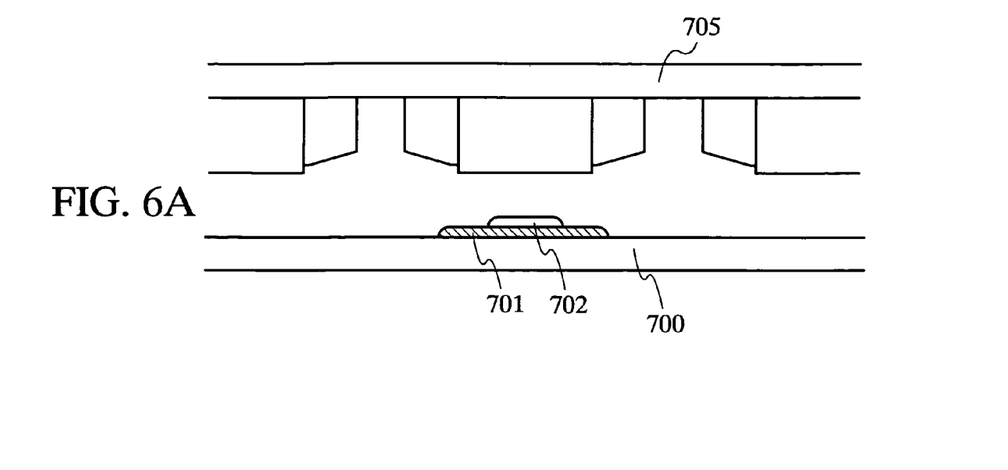
FIGS. 6A to 6C show a process for manufacturing a semiconductor device using a plasma treatment apparatus of the present invention.

FIG. 6A shows a process for forming a conductive film to be a gate electrode and a wiring. At first, a substrate 700 over which a TFT and a light-emitting device are to be formed is provided. Specifically, a glass substrate such as a barium borosilicate glass or an aluminoborosilicate glass, a quartz substrate, a ceramic substrate, or the like can be used as the substrate 700. Further, a metal substrate or a semiconductor substrate with an insulating film formed on the surface thereof may be used. Although a substrate made of a flexible synthetic resin such as plastics generally tends to have a low heat resistance temperature compared to the above-described substrate, the substrate can be used if it can resist a processing temperature in a manufacturing process. A surface of the substrate 700 may be planarized by polishing with the use of a technique such as CMP.

Subsequently, a conductive film 701 to be a gate electrode and a wiring is formed on the surface of the substrate 700 by sputtering, CVD, or droplet discharging method. Specifically, a conductive material, for example, metal such as aluminum, titanium, tantalum, molybdenum, silver, gold, or copper, or a metal compound thereof, or the like is used for the conductive film. Note that the droplet discharging method here means a method for forming a predetermined pattern by discharging a droplet including a predetermined composition from a pore, and includes ink-jetting or the like in the category. By adopting droplet discharging method, various wirings represented by a signal line and a scanning line, a gate electrode of a TFT, an electrode of a light-emitting device, and the like can be formed without using a mask for exposure. In the case of adopting droplet discharging method, a conductive film need not be formed over the entire surface of the substrate, and may be selectively formed in the vicinity of a region where a gate electrode and a wiring are to be formed.

Subsequently, a mask pattern 702 for forming a gate electrode and a wiring is formed over the conductive film 701. The mask pattern 702 can be formed by selectively discharging a composition by droplet discharging method. Further, resist may be applied to the entire surface of the substrate to form the mask pattern selectively by photolithography. At this time, an unnecessary portion of resist can be etched by the plasma treatment apparatus. In the case of using the plasma treatment apparatus, etching need not be performed to the entire surface of the substrate, and may be performed selectively by operating nozzles of a nozzle body 705.

Figure 6B:
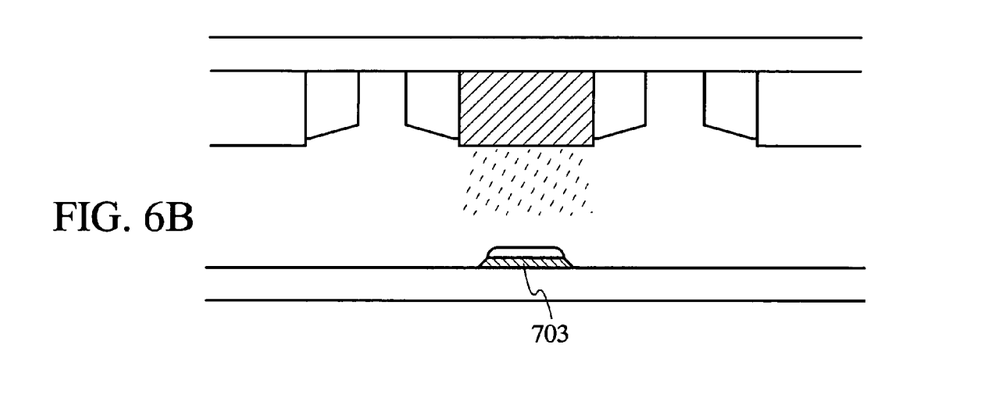

Subsequently, a gate electrode and a wiring 703 are formed by etching the conductive film 701 with the use of the mask pattern 702 (FIG. 6B). Etching is performed by using a plasma treatment apparatus having a film removal unit in which a plurality of discharging nozzles of plasma is arranged in one axis direction, thereby removing an unnecessary portion of the conductive film. A reactive gas such as a fluoride gas or a chloride gas is used for etching the conductive film 701. The reactive gas need not be discharged to the entire surface of the substrate 700, and etching may be selectively performed by operating nozzles of the nozzle body 705 in the vicinity of the region in which the mask pattern is formed.

Figure 6C:
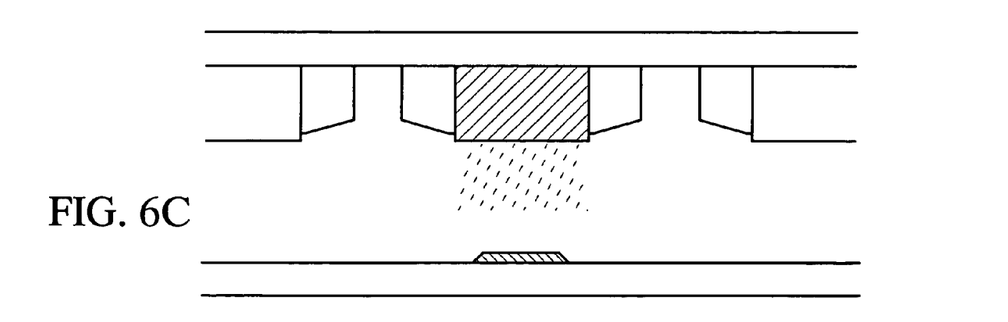

FIG. 6C shows a process for removing the mask pattern 702. The plasma treatment apparatus having the film removal unit in which a plurality of discharging nozzles of plasma is arranged in one axis direction is used, thereby removing the mask pattern. In the case of performing an oxygen plasma treatment for surface modification by using the nozzle body 705, the treatment need not be performed to the entire surface similarly as described above. The oxygen plasma treatment may be performed selectively by operating nozzles of the nozzle body 705 in the vicinity of the region in which the mask pattern is formed.

Figure 7A:
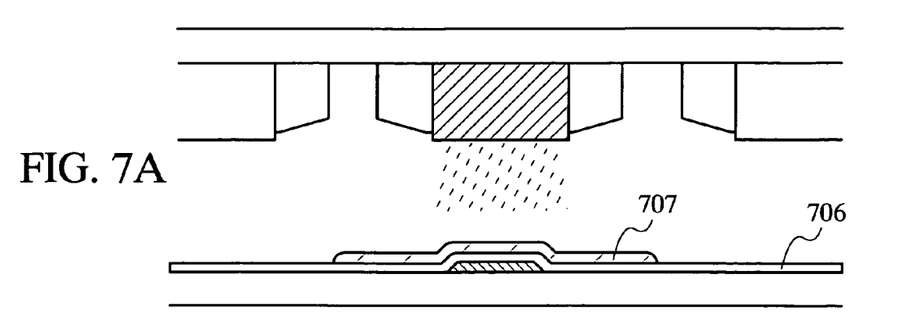
FIGS. 7A to 7C show a process for manufacturing a semiconductor device using a plasma treatment apparatus of the present invention.

Subsequently, a gate insulating film 706 and an island non-single-crystal semiconductor film 707 are formed by using a plasma treatment apparatus of the present invention (FIG. 7A). A laminate body thereof may be formed continuously by providing a plurality of the nozzle for forming each film, or may be laminated sequentially by changing a reactive gas each time the nozzle body 705 is scanned. In the case of forming the film, plasma is generated in a limited minimum region, not in the whole area of the substrate 700. For example, the film is formed by supplying a plasma reactive gas from the nozzle body 705 only in a region where the island semiconductor film is to be formed in the case of forming the semiconductor film. In the case of forming a silicon oxide film as the semiconductor film, an oxide gas such as a mixed gas of silane and oxygen, or TEOS may be used as the reactive gas. The gate insulating film 706 may be formed over the entire surface of the substrate, or may be formed selectively in the vicinity of a region where the TFT is formed.

Figure 7B:
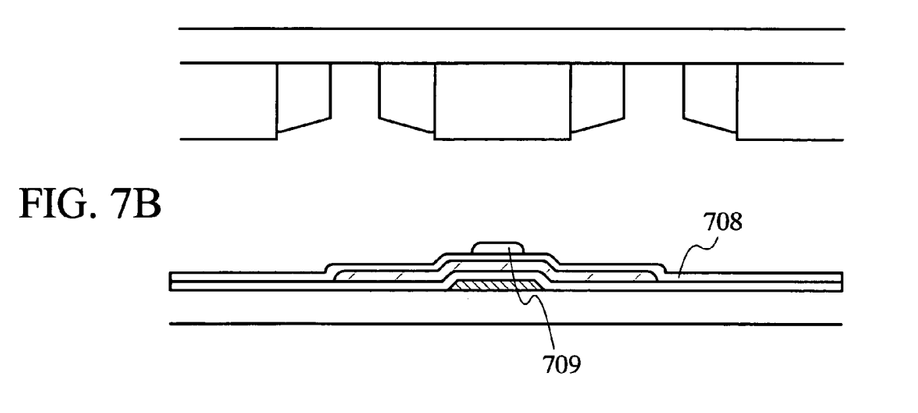

Subsequently, a protective film 708 is formed by generating plasma in a required region similarly as the gate insulating film and the semiconductor film, and a mask pattern 709 for forming a channel protective film is formed thereon (FIG. 7B). The mask pattern 709 may be formed by droplet discharging method or photolithography and plasma treatment apparatus of the present invention similarly as in FIG. 6A.

Figure 7C:
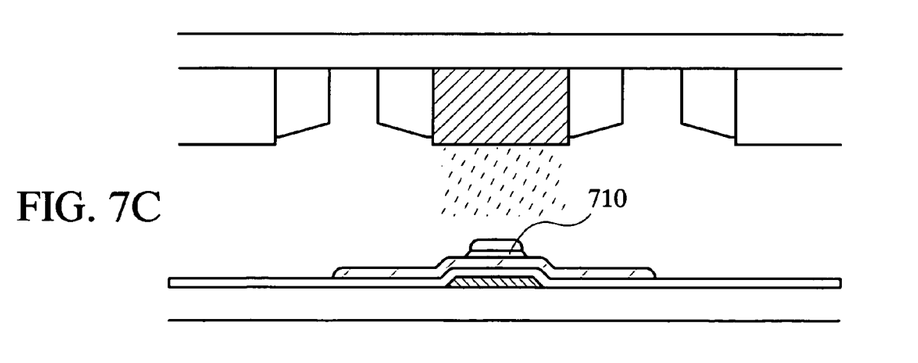

Then, the protective film 708 is etched by using the mask pattern 709, and a channel protective film 710 is formed (FIG. 7C). In the case that the channel protective film is formed of a silicon nitride film, a fluoride gas such as $SF_6$ may be used. Thereafter, the mask pattern 709 is removed similarly as in FIG. 6C.

Figure 8A:
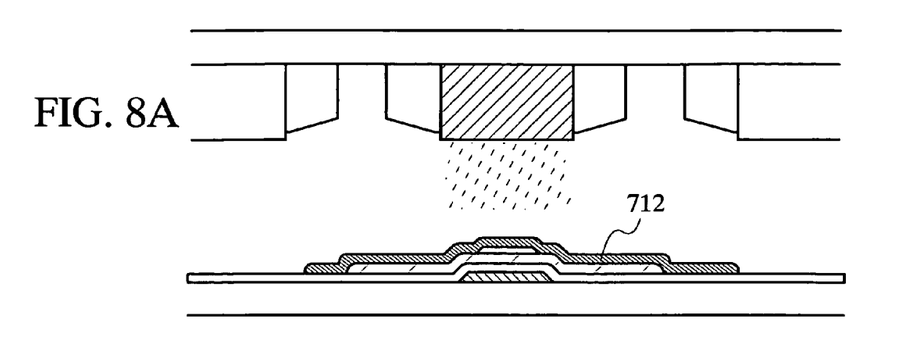
FIGS. 8A to 8C show a process for manufacturing a semiconductor device using a plasma treatment apparatus of the present invention.

Then, a non-single-crystal semiconductor film of one conductivity 712 including an impurity element is formed in order to form source and drain regions of the TFT (FIG. 8A). Typically, an n-type non-single-crystal semiconductor film represented by silicon is formed. In this case, a mixed gas of a silicide gas such as silane and a gas including an element belonging to Group 15 of the periodic table represented by phosphine may be used as a reactive gas supplied from the nozzle body 705 in the present invention.

Afterwards, source and drain wirings 713 and 714 are formed. The source and drain wirings can be formed by photolithography and plasma treatment apparatus of the present invention or droplet discharging method. In the case of adopting droplet discharging method, wiring patterns of the source and drain are formed directly by selectively discharging a conductive composition including a metal microparticle having a grain size of approximately 1 μm. Droplet discharging method has advantage of not requiring a mask that is necessary in the case of photolithography and of requiring only a minimum material.

Figure 8B:
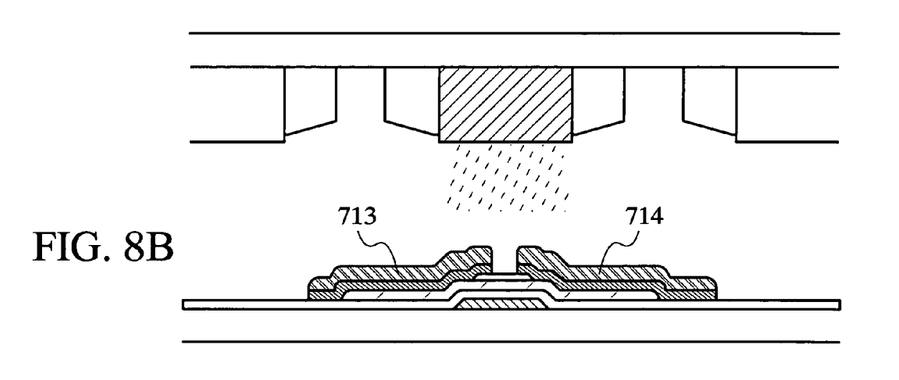

Thereafter, the non-single-crystal semiconductor film of one conductivity 712 located in the lower layer side of source and drain wirings is etched by using the previously formed source and drain wirings 713 and 714 as a mask (FIG. 8B). Etching is performed by discharging a plasma fluoride gas from the nozzle body 705. In this case, quantity of the reactive gas to be discharged is made different in a wiring forming region and other region, and the gas is discharged in large quantity onto an exposed region of the non-single-crystal silicon film, thereby performing etching to an appropriate degree and reducing the consumption of the reactive gas.

Figure 8C:
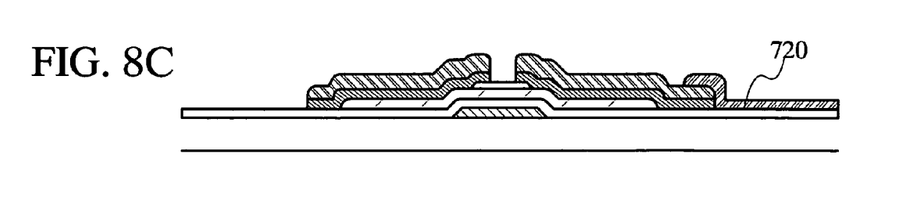

Subsequently, a transparent pixel electrode 720 is formed as shown in FIG. 8C. The pixel electrode 720 can be formed directly into a predetermined pattern over the substrate by droplet discharging method using a composition including powder of a conductive particle such as indium tin oxide, tin oxide, or zinc oxide. Thus, resistance of a contact portion particularly with the non-single-crystal semiconductor film of one conductivity 712 can be lowered by using a composition in which a particle of indium tin oxide is dispersed in a conductive polymer as a composition of the pixel electrode.

Further, the TFT is formed by using the plasma treatment apparatus having the nozzle body 705 in the above-described manufacturing step; however, the TFT can be formed efficiently by providing one plasma treatment apparatus with a nozzle body comprising nozzles of different sizes and by using a nozzle appropriate for the treatment. A different structure from the above-described manufacturing process is shown in FIGS. 9A to 9D.

Figure 9A:
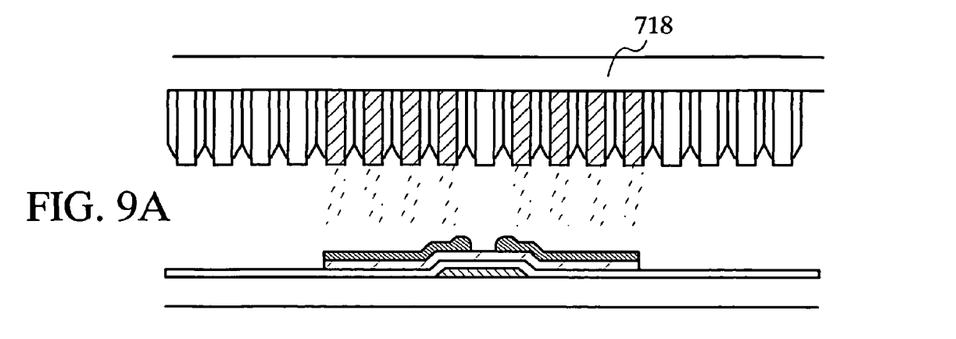
FIGS. 9A to 9D show a process for manufacturing a semiconductor device using a plasma treatment apparatus of the present invention.

For instance, the non-single-crystal semiconductor film 707, the protective film 710, and the non-single-crystal semiconductor film of one conductivity 712 are provided in advance, and etching is performed by using the source and drain wirings 713 and 714 as a mask, thereby forming a source region and a drain region as shown in FIG. 8B. However, a following etching becomes unnecessary by forming the source region and the drain region separately with the use of a plasma treatment apparatus having a nozzle body 718 comprising minuter nozzles as shown in FIG. 9A. Accordingly, the channel protective film 710 also becomes unnecessary, and steps can be simplified drastically.

Figure 9B:
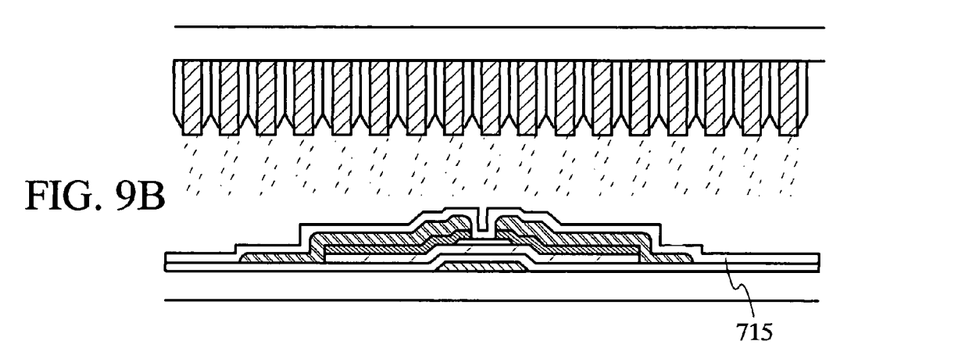

Besides, subsequently, a protective film 715 may be formed over the entire surface as shown in FIG. 9B. In this case, a film is formed by discharging a plasma reactive gas from the nozzle body 718. Typically, a silicon nitride film is used for the protective film 715.

Figure 9C:
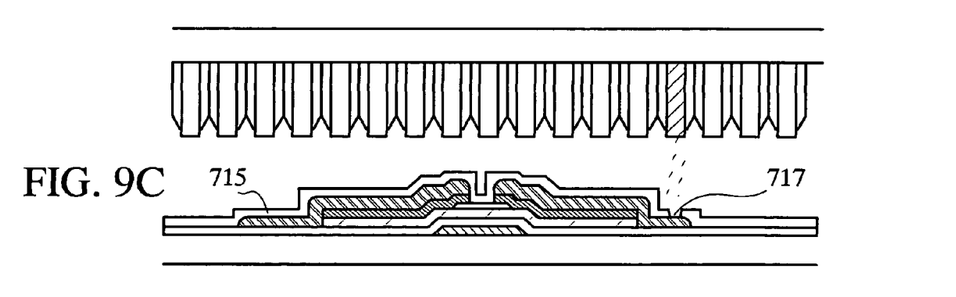

After forming the protective film 715, a contact hole is formed in the protective film 715 for electrically connecting a drain electrode and a pixel electrode that is formed later (FIG. 9C). The contact hole can be formed by applying photolithography; however, a contact hole 717 can be formed here without a mask by selectively discharging the plasma reactive gas from the nozzle body 718 onto a region where the contact hole is formed. At this time, a plasma treatment apparatus having a nozzle corresponding a diameter of the contact hole is preferably used. Here, the minuter nozzle body 718 than the nozzle body 705 used in order to form the above-described semiconductor layer is used. The TFT can be formed efficiently by providing one plasma treatment apparatus with a nozzle body comprising nozzles having different sizes and by using a nozzle appropriate for the treatment.

Figure 9D:
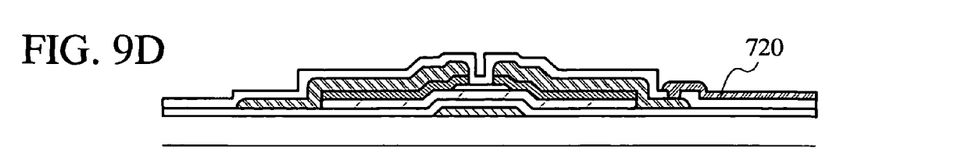

Afterwards, a pixel electrode 720 is formed as shown in FIG. 9D. The pixel electrode can be formed directly into a predetermined pattern over the substrate by droplet discharging method using a composition including powder of a conductive particle such as indium tin oxide, tin oxide, or zinc oxide.

According to the above-described processes, the active matrix display device provided with the TFT in each pixel can be formed by using the plasma treatment apparatus.

[Embodiment Mode 5]

An example of the plasma treatment apparatus used in the above embodiment modes is described with reference to FIGS. 3A and 3B.

Figure 3A:
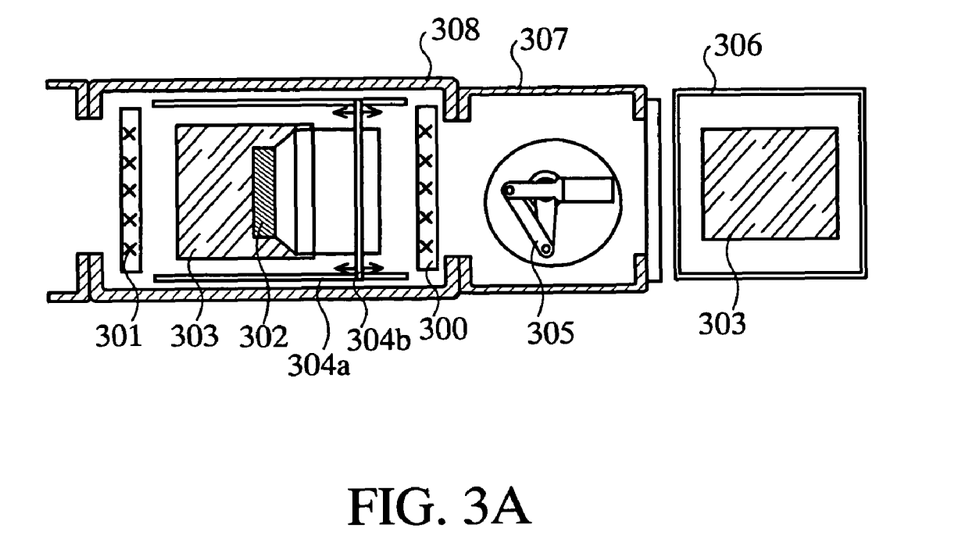
FIGS. 3A and 3B show an example of an atmospheric pressure plasma apparatus used for carrying out the present invention.
Figure 3B:
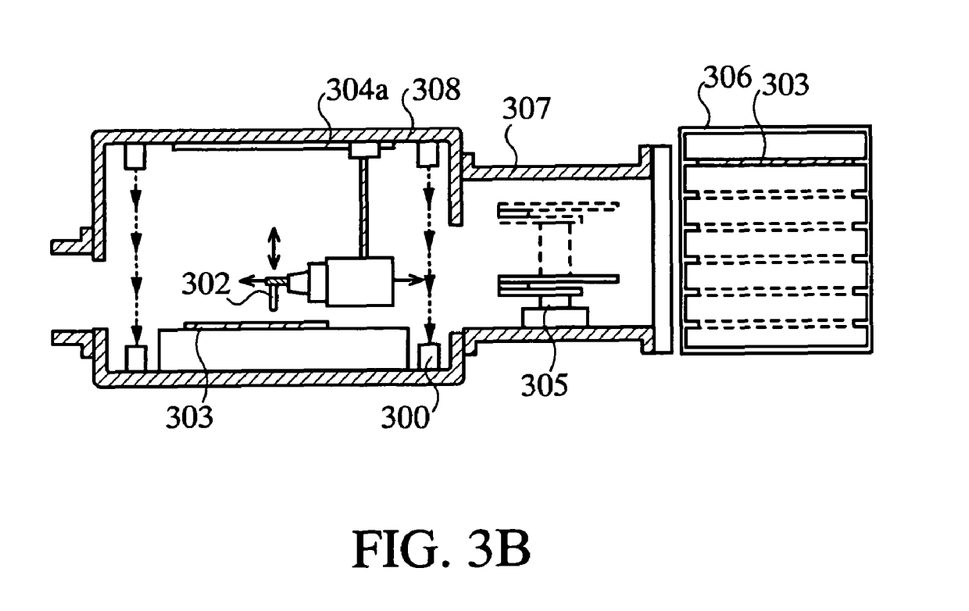

FIGS. 3A and 3B are a top plan view and a cross-sectional view of the apparatus respectively. A subject 303 such as a glass substrate or a resin substrate represented by a plastic substrate of a desired size is placed in a cassette 306 in the FIGS. 3A and 3B. Horizontal transport is given as a method for transporting the subject 303; however, vertical transport may be adopted for the purpose of reducing an area occupied by a transporting machine or for other purposes.

In a transport chamber 307, the subject 303 disposed in the cassette 306 is transported to a plasma treatment chamber 308 by a transport mechanism 305 (such as a robot arm). An air-flow controlling unit 300, rails 304a and 304b for transporting a plasma generation unit 302 of the present invention, a transport unit for transporting the subject 303, and the like are installed in the plasma treatment chamber 308 adjacent to the transport chamber 307. Further, a known heating unit such as a lamp may be appropriately provided.

The air-flow controlling unit 300 aims at protection against dust and controls air flow to shut out outside air by using an inert gas discharged from a discharging nozzle 301. The plasma generation unit 302 moves to a predetermined position using the rail 304a disposed in a transport direction of the subject 303 or the rail 304b disposed in a perpendicular direction to the transport direction of the subject 303.

[Embodiment Mode 6]

In this embodiment mode, various electronics completed by employing the present invention is described. The following can be given as such the electronics: a video camera; a digital camera; a goggle type display (head mounted display); a navigation apparatus; an audio reproducing apparatus (car audio, an audio component, and the like); a laptop personal computer; a game machine; a portable information terminal (a mobile computer, a cellular phone, a portable game machine, an electronic book, or the like); an image reproducing device with a recording medium (specifically, a device capable of reproducing a recording medium such as a Digital Versatile Disk (DVD) and having a display that can display the image); and the like. Practical examples of these electrics are shown in FIGS. 4A to 4H.

Figure 4A:
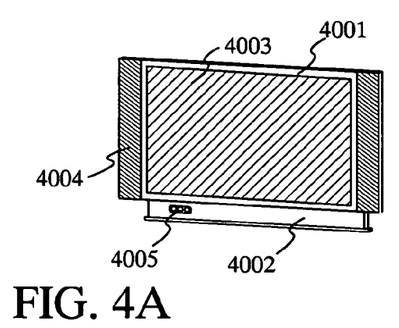
FIGS. 4A to 4H show examples of electronics.

FIG. 4A shows a display device including a case 4001, a supporting section 4002, a display portion 4003, speaker portions 4004, a video input terminal 4005, and the like. The present invention can be applied to manufacturing an integrated circuit comprising the display portion 4003. The display device shown in FIG. 4A is completed by applying the present invention. In addition, the display device includes all display devices for displaying information, including ones for personal computers, for TV broadcasting reception of from 20 inches to 80 inches, and for advertisement.

Figure 4B:
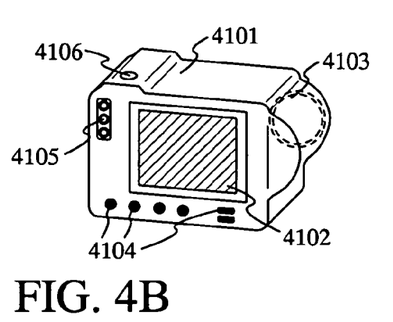

FIG. 4B shows a digital still camera including a main body 4101, a display portion 4102, an image receiving portion 4103, operation keys 4104, an external connection port 4105, a shutter 4106, and the like. The present invention can be applied to manufacturing an integrated circuit comprising the display portion 4102. The digital still camera shown in FIG. 4B is completed by applying the present invention.

Figure 4C:
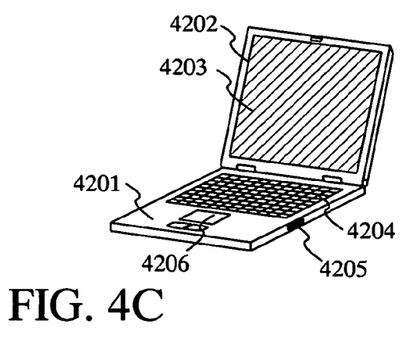

FIG. 4C shows a laptop personal computer including a main body 4201, a case 4202, a display portion 4203, a keyboard 4204, an external connection port 4205, a pointing mouse 4206, and the like. The present invention can be applied to manufacturing an integrated circuit comprising the display portion 4203. The lap top personal computer shown in FIG. 4C is completed by applying the present invention.

Figure 4D:
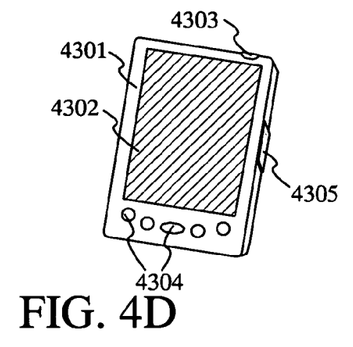

FIG. 4D shows a mobile computer including a main body 4301, a display portion 4302, a switch 4303, operation keys 4304, an infrared port 4305, and the like. The present invention can be applied to manufacturing an integrated circuit comprising the display portion 4302. The mobile computer shown in FIG. 4D is completed by applying the present invention.

Figure 4E:
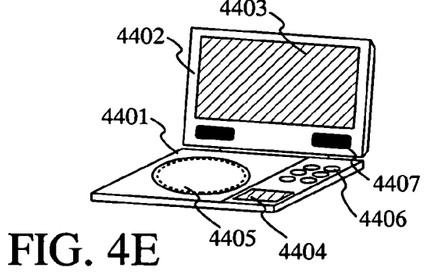

FIG. 4E shows a portable image reproducing device with a recording medium (specifically, a DVD player) including a main body 4401, a case 4402, a display portion A 4403, a display portion B 4404, a recording medium (DVD or the like) reading portion 4405, operation keys 4406, speaker portions 4407, and the like. The display portion A 4403 mainly displays image information whereas the display portion B 4404 mainly displays text information, and the present invention can be applied to manufacturing an integrated circuit comprising the display portion A 4403 and the display portion B 4404. Note that the image reproducing device with a recording medium includes a domestic game machine and the like. The DVD player shown in FIG. 4E is completed by applying the present invention.

Figure 4F:
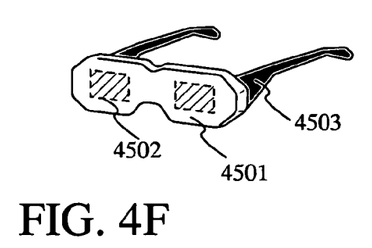

FIG. 4F shows a goggle type display (head mounted display) including a main body 4501, display portions 4502, and arm portions 4503. The present invention can be applied to manufacturing an integrated circuit comprising the display portions 4502. The goggle type display shown in FIG. 4F is completed by applying the present invention.

Figure 4G:
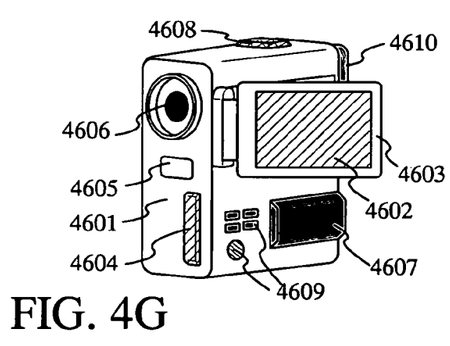

FIG. 4G shows a video camera including a main body 4601, a display portion 4602, a case 4603, an external connection port 4604, a remote control receiving portion 4605, an image receiving portion 4606, a battery 4607, an audio input portion 4608, operation keys 4609, an eye piece portion 4610, and the like. The present invention can be applied to manufacturing an integrated circuit comprising the display portion 4602. The video camera shown in FIG. 4G is completed by applying the present invention.

Figure 4H:
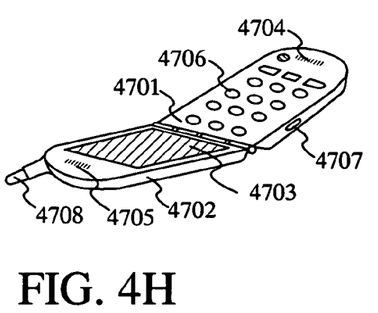

FIG. 4H shows a cellular phone including a main body 4701, a case 4702, a display portion 4703, an audio input portion 4704, an audio output portion 4705, operation keys 4706, an external connection port 4707, an antenna 4708, and the like. The present invention can be applied to manufacturing an integrated circuit comprising the display portion 4703. If the display portion 4703 displays white letters on black background, the cellular phone consumes less power. The cellular phone shown in FIG. 4H is completed by applying the present invention.

As described above, the present invention can be fairly widely applied to electronics of all fields. In addition, a semiconductor device of any structure described in the present invention may be applied to the electronics shown here.

Plasma can be generated in a limited minimum region of a substrate to be treated and a particle generated in a plasma treatment can be reduced by using a plasma treatment apparatus comprising a plurality of minute plasma generation units. Consequently, performance of a product manufactured by applying a plasma treatment is improved, and yield is also improved.

Further, plasma treatment can be performed to a predetermined region, thereby eliminating a photolithography. As a result, production time for a product manufactured by applying a plasma treatment is shortened. Moreover, production cost decreases since number of steps decreases.

What is claimed is:

1. A plasma treatment apparatus comprising:
a plasma generation unit comprising a first electrode provided on a first substrate and a plurality of second electrodes opposed to the first electrode and provided on a second substrate, wherein the first electrode and the plurality of second electrodes are substantially planar and are disposed in parallel;
a gas supply unit adapted to discharge a process gas into a space between the first electrode and the plurality of second electrodes and onto a third substrate to be treated; and
a unit for controlling a voltage applied to a selected electrode among the plurality of second electrodes,
wherein the plurality of second electrodes are arranged linearly in one line,
wherein at least one of the plurality of second electrodes has a length of equal to or less than 1 mm along the one line, on a side of the third substrate to be treated,
wherein the first electrode and the plurality of second electrodes are arranged perpendicular to the third substrate to be treated, and
wherein the plasma generation unit is configured to move in an X direction and a Y direction.

2. A plasma treatment apparatus according to claim 1, wherein the plurality of second electrodes are processed by using a focused ion beam apparatus, photolithography, or a laser lithography apparatus.

3. A plasma treatment apparatus according to claim 1, wherein the first electrode and the plurality of second electrodes are covered with a dielectric film.

4. A plasma treatment apparatus according to claim 1, wherein the voltage is applied to the predetermined electrode for performing a film formation, an etching treatment, or a surface modification over the third substrate to be treated.

5. A plasma treatment apparatus according to claim 4, wherein the film formation, the etching treatment, or the surface modification is performed under atmospheric pressure or under pressure approximate to atmospheric pressure.

6. A plasma treatment apparatus according to claim 1 further comprising a stage to which the third substrate to be treated is fixed,
wherein a scanning of the stage is synchronized with the application of the voltage to the predetermined electrode.

7. A plasma treatment apparatus according to claim 1, wherein the discharged process gas acts on the third substrate to be treated.

8. A plasma treatment apparatus according to claim 1, wherein the plasma generation unit is adapted for movement in an X direction and a Y direction relative to the position of the third substrate to be treated.

9. A plasma treatment apparatus of claim 1, wherein a plurality of first electrodes are formed on the first substrate.

10. A plasma treatment apparatus of claim 1, wherein the first substrate and second substrate comprise a non-conductive material.

11. A plasma treatment apparatus comprising:
a plasma generation unit comprising a first electrode provided on a first substrate and a plurality of second electrodes opposed to the first electrode and provided on a second substrate, the plasma generation unit being adapted to form a pattern on a third substrate to be treated, and wherein the first electrode and the plurality of second electrodes are substantially planar and are disposed in parallel;
a gas supply unit adapted to discharge a process gas into a space between the first electrode and the plurality of second electrodes and onto the third substrate to be treated; and
a unit for controlling a voltage applied to a selected electrode among the plurality of second electrodes,
wherein the plurality of second electrodes are arranged linearly in one line, wherein at least one of the plurality of second electrodes has a length along the one line, of equal to or less than a square of a line width of the pattern on a side of the third substrate to be treated wherein the first electrode and the plurality of second electrodes are arranged perpendicular to the third substrate to be treated, and wherein the plasma generation unit is configured to move in an X direction and a Y direction.

12. A plasma treatment apparatus according to claim 11, wherein the pattern is a wiring pattern.

13. A plasma treatment apparatus according to claim 11, wherein the plurality of second electrodes are processed by using a focused ion beam apparatus, photolithography, or a laser lithography apparatus.

14. A plasma treatment apparatus according to claim 11, wherein the first electrode and the plurality of second electrodes are covered with a dielectric film.

15. A plasma treatment apparatus according to claim 11, wherein the forming of the pattern is performed under atmospheric pressure or under pressure approximate to atmospheric pressure.

16. A plasma treatment apparatus according to claim 11 further comprising a stage to which the third substrate to be treated is fixed, wherein a scanning of the stage is synchronized with the application of the voltage to the predetermined electrode.

17. A plasma treatment apparatus according to claim 11, wherein the discharged process gas acts on the third substrate to be treated.

18. A plasma treatment apparatus according to claim 11, wherein the plasma generation unit is adapted for movement in an X direction and a Y direction relative to the position of the third substrate to be treated.

19. A plasma treatment apparatus of claim 11, wherein a plurality of first electrodes are formed on the first substrate.

20. A plasma treatment apparatus of claim 11, wherein the first substrate and second substrate comprise a non-conductive material.

* * * * *